United States Patent
Ruffieux

(10) Patent No.: US 6,943,637 B2
(45) Date of Patent: Sep. 13, 2005

(54) VOLTAGE CONTROLLED OSCILLATOR CIRCUIT FOR A LOW POWER ELECTRONIC DEVICE

(75) Inventor: David Ruffieux, Belfaux (CH)

(73) Assignee: CSEM, Centre Suisse d'Electronique et Microtechnique SA, Neuchatel (CH)

( * ) Notice: Subject to any disclaimer, the term of this patent is extended or adjusted under 35 U.S.C. 154(b) by 117 days.

(21) Appl. No.: 10/721,897

(22) Filed: Nov. 26, 2003

(65) Prior Publication Data

US 2004/0104782 A1 Jun. 3, 2004

(30) Foreign Application Priority Data

Nov. 28, 2002 (EP) .......................................... 02080009

(51) Int. Cl.[7] ................................................. H03B 5/12
(52) U.S. Cl. ........................... 331/117 FE; 331/117 R; 331/177 V; 331/186
(58) Field of Search .......................... 331/36 C, 116 R, 331/116 FE, 116 M, 117 R, 117 FE, 117 D, 177 R, 177 V, 185–186

(56) References Cited

U.S. PATENT DOCUMENTS 5,561,398 A * 10/1996 Rasmussen ............... 331/36 C
6,268,777 B1   7/2001 Welch

OTHER PUBLICATIONS

Margarit M A et al: "A Low Noise, Low-Power VCO with Automatic Amplitude Control for Wireless Applications" IEEE Journal of Solid-State Circuits, IEEE Inc., New York, US, vol. 34, No. 6, Jun. 1999, p. 761–711.

Zanchi A et al: A 2–V 2.5 GHz—104–dBc/Hz at 100 kHz Fully Integrated VCO with Wide–Band Low–Noise Automatic Amplitude Control Loop, IEEE Journal of Solid–State Circuits, IEEE Inc., New York, US, vol. 36. No. 4, Apr. 2001, pp. 611–619.

* cited by examiner

*Primary Examiner*—David Mis
(74) *Attorney, Agent, or Firm*—Sughrue Mion, PLLC

(57) ABSTRACT

The voltage controlled oscillator circuit includes a resonant circuit, with two inductive elements (L1, L2) and a variable capacitive element ($C_V$), which is connected to a high potential terminal ($V_{EXT}$) of a voltage source, and a pair of cross-coupled NMOS transistors (N1, N2), which is connected between two oscillating signal ($V_A$, $V_B$) output terminals of the resonant circuit. Each NMOS transistor of the pair is connected in parallel to a diode mounted NMOS transistor (N3, N4) so as to form a current mirror. An identical current is supplied to each diode mounted transistor in an oscillating signal amplitude regulation loop. Two resistors (R1, R2) series connected between the gates of the transistors of the pair (N1, N2) allow extraction of the common mode voltage to be stored in a filtering capacitor (Cm) in order to bias a reference NMOS transistor (N5) connected to a reference resistor (R3). The current value supplied to the diode mounted transistors is dependent upon the value of the resistor and the detected common mode voltage. Consequently, the common mode voltage decreases with an increase in the oscillating signal amplitude, and vice versa.

This oscillator circuit can be used in a low power electronic device, such as a portable telephone or a watch.

10 Claims, 3 Drawing Sheets

VOLTAGE CONTROLLED OSCILLATOR CIRCUIT FOR A LOW POWER ELECTRONIC DEVICE

The invention concerns a voltage controlled oscillator circuit, particularly for a low power electronic device, such as a portable telephone or a watch. This voltage controlled oscillator circuit can form part of a frequency synthesiser. It includes, in particular, a resonant circuit, formed of a voltage variable capacitive element and at least one inductive element, which is connected to a pair of cross-coupled transistors, which compensates for the resonant circuit losses.

Voltage controlled oscillators, or VCOs, mainly produce high frequency signals. The frequency of these high frequency signals generally depends upon the capacitive value of a resonant circuit. This capacitive value is modified as a function of a control voltage applied to the varactor. In the case of use in a frequency synthesiser, this filtered control voltage originates from a phase detector of a phase lock loop.

Such oscillator circuits are found, for example, in portable telecommunication apparatus for transmitting data on a carrier frequency that can be comprised between several hundred MHz to several GHz. These oscillator circuits can also be used for demodulating operations in radiofrequency signal receivers, for example.

Since these oscillator circuits can be fitted to portable objects or apparatus, which include a battery or accumulator of small size, it is often necessary to reduce their electric power consumption, and their supply voltage.

In conventional oscillator circuits, it is often necessary to impose a sufficiently large bias current on the pair of transistors to take into account of the phase noise and the worst quality factor of the resonant circuit. This involves significant electric power consumption, which is a drawback.

Multiple other embodiments of oscillator circuits have also been proposed so as to limit current consumption. The oscillator circuit can include, for example an amplitude regulation loop so as to control the current necessary to obtain sufficient oscillation amplitude. In this regard, the publication entitled "A 2V 2.5 GHz -104dBc/Hz at 100 kHz Fully Integrated VCO with Wide-Band Low-Noise Automatic Amplitude Control Loop" by A. Zanchi, C. Samori, S. Levantino and A. L. Lacaita and published in the IEEE Journal of Solid-State Circuits, volume 36, no. 4 April 2001, can be cited. In this publication, there is described a voltage controlled oscillator that includes an automatic oscillation amplitude control loop.

This oscillator circuit, described in the aforementioned publication, is shown schematically in FIG. 1. Oscillator circuit 1 includes a differential pair of bipolar cross-coupled transistors 4 and 5, which is connected to a resonant circuit. The resonant circuit is formed by at least one capacitor Cv and two inductive elements L1 and L2, which are connected to a high potential terminal $V_{CC}$ of a voltage source. The base of each transistor 4 and 5 is coupled by capacitors Ca and Cb to the collector of the other transistor. A biasing of transistors 4 and 5 is imposed by a voltage source Vb via two resistors Ra and Rb connected to the base of transistors 4 and 5, respectively. The differential pair of cross-coupled transistors allows a negative transconductance to be supplied to the resonant circuit. The negative transconductance compensates for the resonant circuit conductance loss to obtain oscillating signals.

A variable current source is represented by transistor 6 placed in series with the differential pair and the resonant circuit. An amplitude detector 2 detects the maximum amplitude of the oscillations across the collectors of transistors 4 and 5. Moreover, a filter formed by resistor R and capacitor C enables the common mode voltage to be removed to be compared in an amplifier 3 with a reference voltage Vref. Thus, when the oscillation amplitude increases, the value of the current supplied by transistor 6 decreases so as to ensure amplitude regulation.

One drawback of the oscillator circuit proposed in this publication lies in the fact that the noise generated is significant. This noise is due, in particular, to the current source placed in series with the resonant circuit and the differential pair of transistors between the electric power supply terminals.

Another drawback of this oscillator circuit is that it uses a significant number of components for regulating the amplitude of the oscillations, which involves significant electric power consumption for oscillation amplitude regulation and generation of additional noise.

It is an object of the invention to overcome the drawbacks of the prior art by providing a voltage controlled oscillator circuit arranged so as to minimise noise and power consumption while maintaining maximum oscillation amplitude.

Therefore, the invention concerns a voltage controlled oscillator circuit including the features mentioned in claim 1.

Advantageous embodiments of the invention are defined in the dependent claims.

One advantage of the oscillator circuit according to the invention lies in the arrangement of current mirrors, which are achieved with each transistor of the pair placed in parallel with a respective diode mounted transistor. Each diode mounted transistor receives a current from a current source so as to bias each transistor of the pair of transistors. Biasing each transistor of the pair in this manner enables the noise generated to be greatly reduced.

Owing to the non-linearity of the diode mounted transistors, a common mode voltage variation can be detected across each control terminal of the mirror transistors as a function of the amplitude variation of the oscillating signals. Advantageously, two resistors connected in series between the control terminals of the pair of transistors can extract, via their connection node, the common mode voltage in order to store it in a filtering capacitor. The more the oscillating signal amplitude increases, the more the common mode voltage decreases, and vice versa. The value of each current supplied to the diode mounted transistors directly depends upon the variation in the common mode voltage stored in the filtering capacitor. Thus, the current-decreases if the oscillating signal amplitude increases so as to also reduce the electric power consumption of the oscillator circuit.

The amplitude of the oscillating signals is thus limited by the bias current value, and not by the non-linearities of the part supplying the oscillating signals.

The objects, advantages and features of the voltage controlled oscillator circuit will appear more clearly in the following description of embodiments illustrated by the drawings, in which:

FIG. 1, already cited, shows a voltage controlled oscillator circuit of the prior art;

Figure 1:
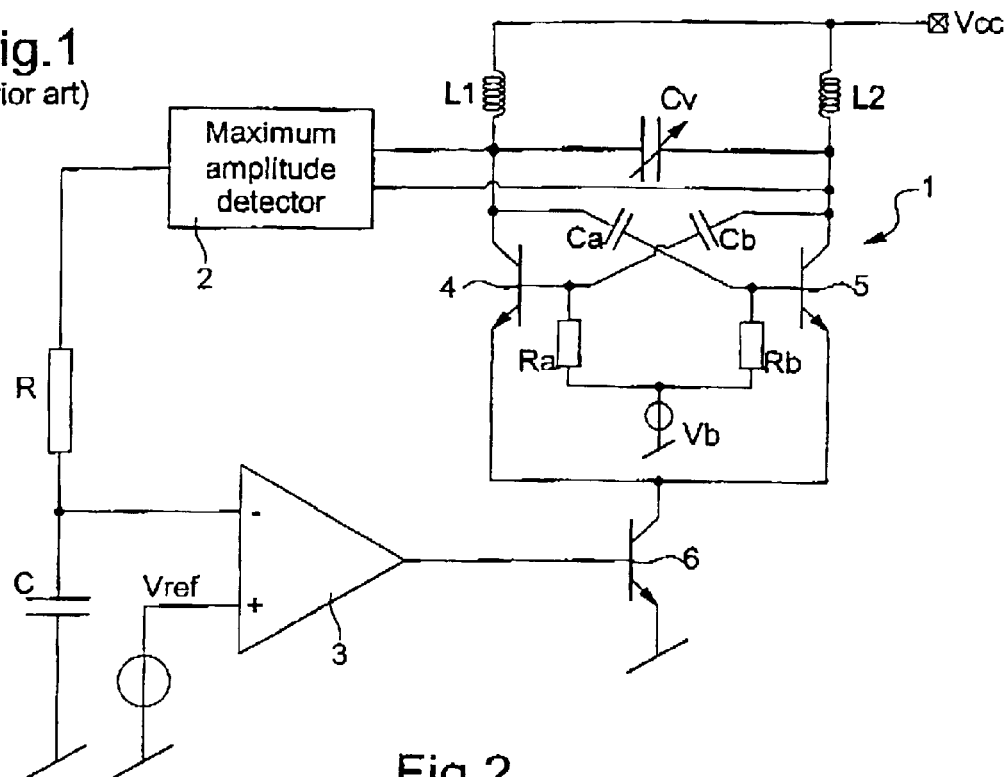
Figure 2:
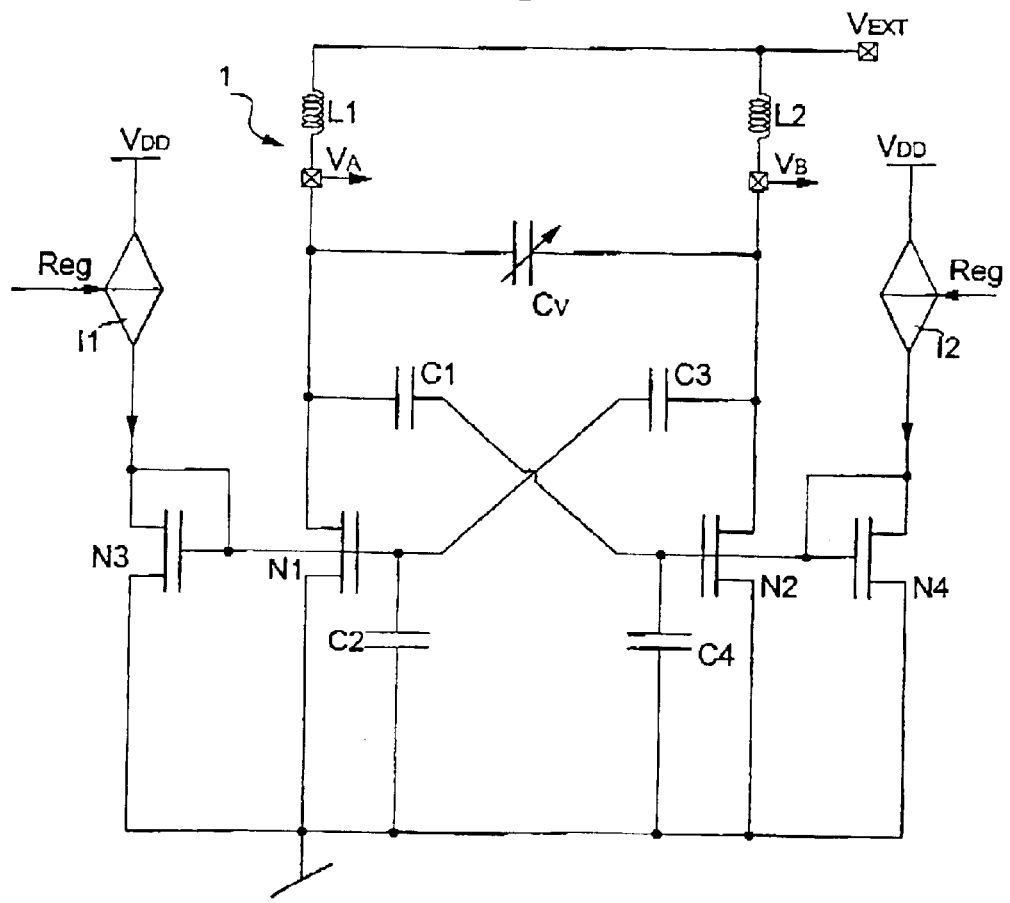
FIG. 2 shows schematically the amplitude regulation principle of the voltage controlled oscillator circuit according to the invention.

FIG. 2 shows generally the electronic components of voltage controlled oscillator circuit 1 according to a first embodiment of the present invention. This oscillator circuit is preferably used in a low power electronic device, such as a portable telephone or a watch for example, without however being limited to use solely in such a low power device. When it forms part of a frequency synthesiser, it generates high frequency oscillating signals, on which data signals are modulated, for example. The carrier frequency of the oscillating signals is adjusted by a continuous supply voltage applied across an input of the oscillator circuit.

This voltage controlled oscillator circuit 1 mainly includes, in a series arrangement between a high potential terminal $V_{EXT}$ and a low potential terminal of a regulated voltage source, a resonant circuit, which is formed by two inductive elements L1 and L2 and a variable capacitive element $C_V$, and a pair of NMOS cross-coupled transistors N1 and N2, to compensate for the resonant circuit losses. The pair of NMOS transistors is connected between oscillating signal output terminals $V_A$ and $V_B$ of the resonant circuit, and a low potential terminal of the regulated voltage, which forms earth.

The first inductive element L1 is connected between terminal $V_{EXT}$ and terminal $V_A$, whereas the second inductive element L2 is connected between terminal $V_{EXT}$ and terminal $V_B$. The capacitive element $C_V$, which represents a varactor, is connected between terminals $V_A$ and $V_B$ of the resonant circuit. The capacitive value of this capacitive element varies as a function of a continuous control voltage applied across a capacitive element, which is not shown. The variation in capacitive value allows the frequency of two oscillating signals in phase opposition to be modified, respectively across the first and second output terminals $V_A$ and $V_B$.

Each NMOS transistor N1 and N2 includes a control terminal which is the gate, and first and second current terminals, which are the drain and the source. The drain of the first transistor N1 of the pair is connected to output terminal $V_A$, whereas the drain of the second transistor N2 of the pair is connected to output terminal $V_B$. The gate of first transistor N1 is connected to the drain of the second transistor N2 via a coupling capacitor C3, whereas the gate of the second transistor N2 is connected to the drain of the first transistor N1 via a coupling capacitor C1. The sources of the two transistors N1 and N2 are connected to the low potential terminal of the regulated voltage source. Through this crossed connection of the gates of each transistor of the pair, a negative transconductance is created so as to entirely compensate for the resonant circuit losses.

Generally, the resonant circuit can be represented by placing in parallel an inductive element, a variable capacitor and a loss conductance. Thus, the negative transconductance placed in parallel of the resonant circuit elements has to be greater than the parallel loss conductance in the start phase of the oscillator circuit. Once the maximum amplitude of the oscillating signals has been stabilised, the negative transconductance and the loss conductance are equal.

Since it is an object of the present invention to reduce the noise generated and the circuit consumption while guaranteeing maximum amplitude for the oscillating signals, each transistor of the pair N1 and N2 is connected in parallel with a diode mounted NMOS transistor N3 and N4. The first diode mounted transistor N3, respectively the second diode mounted transistor N4, each receive a current produced by a first variable current source I1, respectively by a second variable current source I2. In this way, the transistor N1 of the pair and the diode mounted transistor N3 form a first current mirror, whereas the transistor N2 of the pair and the diode mounted transistor N4 form a second current mirror. The current produced by each current source is controlled by a regulation signal Reg so as to reduce the current value when an increase in the oscillating signal amplitude level is detected, and vice versa. Consequently, the oscillator circuit start phase current value is greater than the current value when the oscillating signal amplitude is maximum. The following description with reference to FIGS. 3 and 4 will explain in more detail how the current of each current source is adjusted as a function of the detected oscillating signal amplitude level. It is mainly by the non-linearity of each diode mounted transistor N3 and N4 of each current mirror, that it is possible to extract the current source regulation signal. The more the oscillating signal amplitude level increases, the more the common mode voltage, seen across the gates of the NMOS transistors tends to drop owing to the non-linearity of diode mounted transistors N3 and N4.

It should be noted that the dimension of each NMOS transistor N1 and N2 of the pair is preferably K times greater than the dimension of each diode mounted transistor N3 and N4, K being an integer number higher than 1. The current value imposed in each transistor N1 and N2 of the pair is thus around K times greater than that supplied by each current source I1 and I2. Moreover, the mean current flowing in each transistor of the pair is approximately the same.

In order to divide the control voltage across the gates of the transistors of the pair N1 and N2, a first voltage divider is formed by the coupling capacitor C1 and capacitor C4, which is connected between the gate of transistor N1 and the low potential terminal, and a second voltage divider is formed by coupling capacitor C3 and capacitor C2, which is connected between the gate of transistor N2 and the low potential terminal. Thus, the amplitude of the oscillating signals seen by the gate of each transistor N1 and N2 can be divided by the factor (C1 +C4)/C1 or the factor (C3+C2)/C3. The two division factors are equal. This enables a wide oscillating signal amplitude to be obtained at the output while minimising the amplitude of the signals applied across the gates of transistors N1 and N2 and, consequently, the noise generated by the latter. Preferably, the transistors can operate in weak inversion, which tends to increase the negative transconductance value. However, the transistors of the oscillator circuit could also operate in high inversion.

The oscillator circuit can be powered by a voltage source formed by a battery or an accumulator whose voltage value can fluctuate for example between 1.5V and 0.9V at the end of the battery life. Consequently, the part of the oscillator circuit generating the oscillations could be connected to a regulated voltage source that is not shown. The value of this regulated voltage could be fixed for example at 0.9V, or even at half of this value, as a function of the nominal technology voltage (for example TSMC at 0.18 μm) used to make the oscillator circuit. The generating part of the current sources can be connected directly to the terminals of the power source, which can be a battery. The maximum amplitude value of the oscillating signals can thus be slightly less than 0.9V around regulated voltage $V_{EXT}$, i.e. the peak to peak amplitude of the oscillating signals is close to 1.6V.

Figure 3:
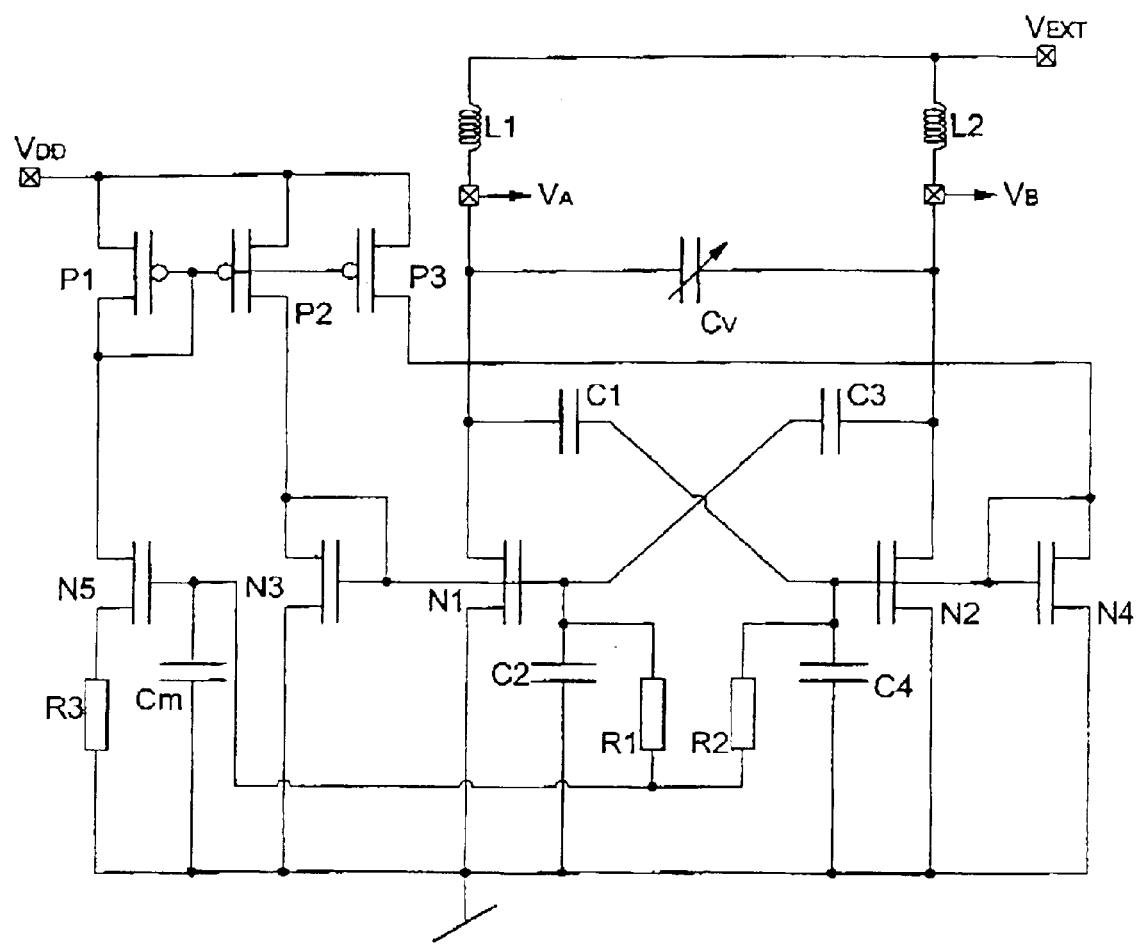
FIG. 3 shows in detail a first embodiment of the voltage controlled oscillator circuit according to the invention.

A first embodiment of the voltage controlled oscillator circuit according to the invention is presented in FIG. 3. It should be noted that the elements of this Figure, which correspond to those described with reference to FIG. 2, bear identical reference signals.

The oscillator circuit of this first embodiment includes the same elements that were described with reference to FIG. 2. This oscillator circuit thus includes the resonant circuit, formed by inductors L1 and L2 and the variable capacitive element Cv, the pair of NMOS cross-coupled transistors N1 and N2, the diode mounted NMOS transistors N3 and N4 and the capacitive dividers C1, C4 and C3, C2. However, the elements of the amplitude regulation loop will be described in more detail.

In the amplitude regulation loop, the variation in the amplitude level of the oscillating signals is detected by two resistors R1 and R2, which are series connected between the gates of the NMOS transistors N1 and N2, and a filtering capacitor Cm, which is connected to the connection node of the two resistors and to the low potential terminal of the supply voltage source. Thus, a common mode voltage, which is the reflection of the mean gate voltage of the transistors of the pair, can be picked up on the filtering capacitor Cm. This common mode voltage decreases if the amplitude of the oscillating signals increases, and vice versa, since the diode mounted NMOS transistors N3 and N4 have non-linear behaviour.

Filtering capacitor Cm is connected to the gate of a reference NMOS transistor N5, whose source is connected to the low potential terminal, i.e. to the earth terminal, via a reference resistor R3. It is this resistor R3 that will determine the current value of each current source as a function of the common mode voltage picked up on the filtering capacitor. The dimension of NMOS transistor N5 has to be M times greater than that of transistors N3 and N4, where M is an integer number higher than 1. Thus, the reference current value depends in part on the natural logarithm of M, the value of reference resistor R3, and the common mode voltage detected across filtering capacitor Cm.

The drain of NMOS transistor N5 supplies a reference current to a diode mounted PMOS transistor of a third current mirror. This third current mirror, which is formed of PMOS transistors, is connected to a high potential terminal of a supply voltage source $V_{DD}$. Two other PMOS transistors P2 and P3 of the third current mirror are connected, via their gate, in parallel with diode mounted PMOS transistor P1, so as to duplicate the reference current. The drain of PMOS transistor P2, which acts as a current source, supplies current to diode mounted NMOS transistor N3. The PMOS transistor P3 supplies current to diode mounted NMOS transistor N4. In this way, the current supplied to each diode mounted NMOS transistor N3 and N4 is directly dependent on the detected oscillating signal amplitude level. Thus, via this arrangement, the oscillating signal amplitude can be automatically regulated owing to the current value supplied to each NMOS transistor N3 and N4.

It should be noted that the loop, formed by NMOS transistors N3, N4 and N5, PMOS transistors P1, P2 and P3 and reference resistor R3, is proportional to the absolute temperature (PTAT).

Within the idea of this first embodiment, a reverse configuration could have been envisaged using a pair of PMOS transistors connected to the high potential terminal of a voltage source. In such case, the resonant circuit is connected between the pair of PMOS transistors and the earth terminal. A diode mounted PMOS transistor has to be connected to each PMOS transistor of the pair. The reference transistor is also a PMOS transistor connected to the high potential terminal of the voltage source via the reference resistor. This reference transistor is biased by the common mode voltage extracted by two resistors series connected between the gates of the pair of PMOS transistors, and stored in the filtering capacitor. This filtering capacitor is connected between the gate of the reference PMOS transistor and the high potential terminal. The current sources for each diode mounted PMOS transistor are achieved using a current mirror formed of NMOS transistors connected to the earth terminal.

Figure 4:
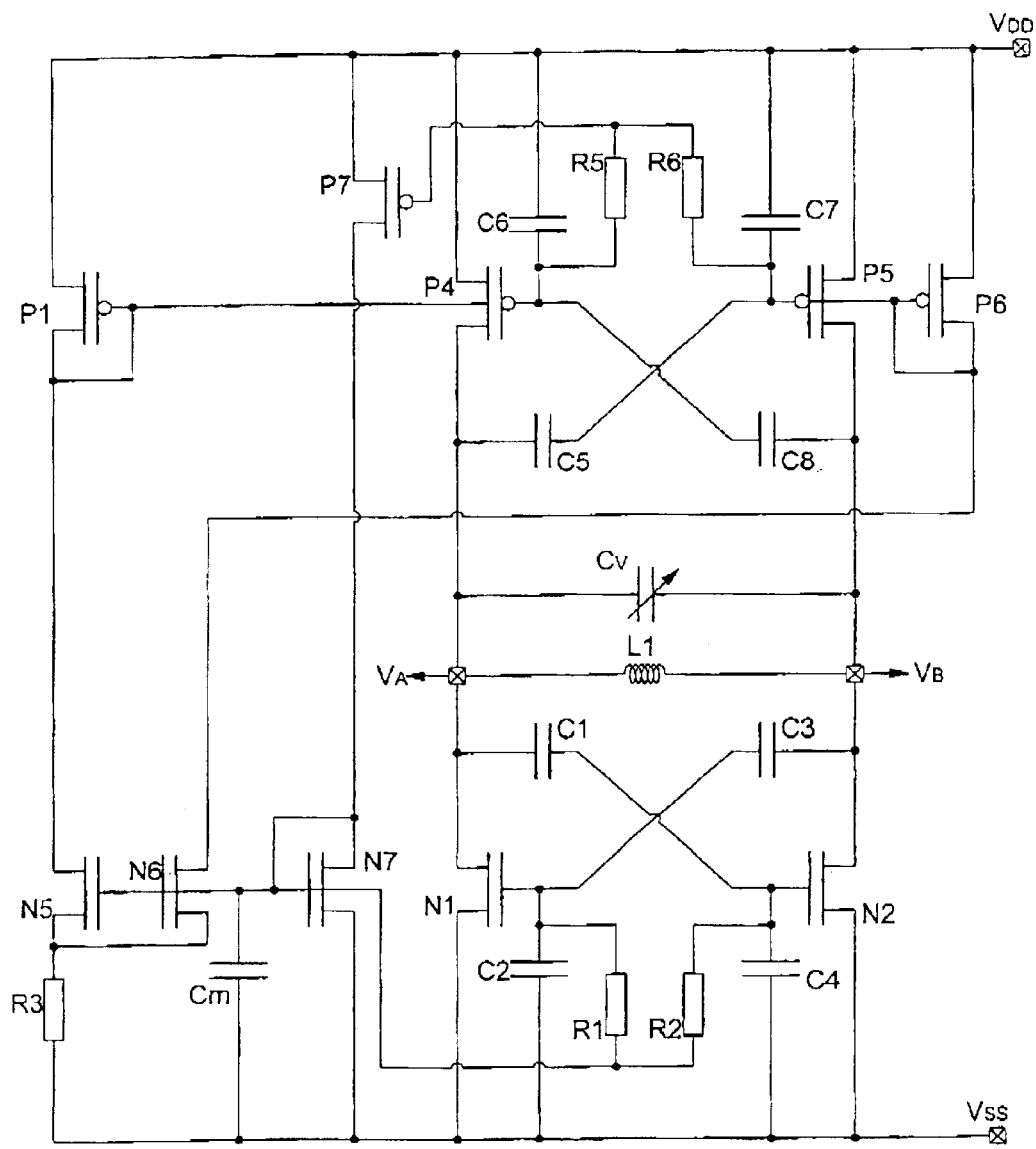
FIG. 4 shows a second embodiment of the voltage controlled oscillator circuit according to the invention.

A second embodiment of the voltage controlled oscillator circuit according to the invention is shown in FIG. 4. It should be noted that the elements of this Figure, which correspond to those described with reference to FIGS. 2 and 3, bear the same reference signs.

This oscillator circuit includes, in a series arrangement between the terminals $V_{DD}$ and $V_{SS}$ of a supply voltage source, a first pair of cross-coupled PMOS transistors P4 and P5, a resonant circuit, and a second pair of cross-coupled NMOS transistors N1 and N2. The resonant circuit includes an inductor L1 in parallel with the variable capacitive element Cv between the two output terminals $V_A$ and $V_B$. The gate of each transistor of the two pairs is connected via a coupling capacitor C1, C3, C5, C8 to the drain of the other transistor of the same pair.

So as to divide the voltage of the oscillating signals in order to supply a control voltage across each gate of the transistors of the two pairs, each coupling capacitor forms part of a capacitive voltage divider. Thus, a first voltage divider is formed by coupling capacitor C1 and capacitor C4, which is connected between the gate of transistor N1 and terminal $V_{SS}$. A second voltage divider is formed by coupling capacitor C3 and capacitor C2, which is connected between the gate of transistor N2 and terminal $V_{SS}$. A third voltage divider is formed by coupling capacitor C5 and capacitor C7, which is connected between the gate of transistor P5 and terminal $V_{DD}$. A fourth voltage divider is formed by coupling capacitor C8 and capacitor C6, which is connected between the gate of transistor P4 and terminal $V_{DD}$. Thus, the amplitude of the oscillating signals seen by the gate of each transistor P4, P5, N1 and N2 can be divided by the factor (C1+C4)/C1, the factor (C3+C2)/C3, the factor (C5+C7)/C5 or the factor (C8+C6)/C8. The four division factors are equal. These capacitive dividers offer the same advantage as that mentioned with reference to FIG. 2.

A diode mounted PMOS transistor P1 is connected in parallel to the PMOS transistor P4 of the pair to form a first current mirror. Diode mounted PMOS transistor P6 is connected in parallel to transistor P5 of the pair to form a second current mirror. Diode mounted PMOS transistor P1 receives a current from a first reference NMOS transistor N5, whereas PMOS transistor P6 receives a current from a second reference NMOS transistor N6. The two reference transistors N5 and N6 are connected in parallel and their source is connected to terminal $V_{SS}$, i.e. to the earth terminal, via a reference resistor R3.

As for the first embodiment, the variation in the oscillating signal amplitude level can be measured due to the non-linearity of the diode mounted PMOS transistors P1 and P6. In the amplitude regulation loop, this variation in the oscillating signal amplitude level is detected by two resistors R5 and R6, which are series connected between the gates of PMOS transistors P4 and P5. The connection node of the two resistors R5 and R6 is connected by an arrangement of return transistors P7 and N7 to a filtering capacitor Cm to supply the detected common mode voltage. The gate of the return PMOS transistor P7, whose source is connected to terminal $V_{DD}$, is directly connected to the connection node of the two resistors R5 and R6. The drain of this PMOS transistor P7 is connected to a diode mounted NMOS transistor N7, whose source is connected to terminal $V_{SS}$. This diode mounted return NMOS transistor N7 supplies the common mode voltage stored in filtering capacitor Cm. This allows capacitor Cm to bias the reference transistors N5 and N6 in order to determine the reference current values as a function of the level of this common mode voltage.

NMOS transistors N1 and N2 of the second pair are biased via two other resistors R1 and R2. These two resistors R1 and R2 are series connected between the gates of NMOS transistors N1 and N2. The connection node of resistors R1 and R2 is connected to filtering capacitor Cm. When oscillating signals appear at the output terminals $V_A$, $V_B$, the linearity of resistors R1 and R2 ensures that the mean current drawn by the second pair of NMOS transistors N1 and N2 is identical to the mean current derived from the first pair of PMOS transistors P4 and P5. Since the division factor of each divider is identical, the two pairs of PMOS and NMOS transistors participate equally in the creation of the oscillating signals.

As previously, the dimension of each PMOS transistor P4 and P5 of the first pair, and each NMOS transistor N1 and N2 of the second pair is preferably K times greater than the dimension of each diode mounted PMOS transistor P1 and P6, K being an integer number greater than 1. The current value created in each PMOS transistor P4 and P5 of the first pair is thus around K times greater than that of the current supplied by each reference transistor N5 and N6. Likewise, the dimension of reference transistors N5 and N6 has to be greater than that of the diode mounted return NMOS transistor N7. In this way, the reference currents, biasing each diode mounted PMOS transistor P1 and P6, depend upon the value of resistor R3, the dimensional ratio between NMOS transistor N7 and reference NMOS transistors N5 and N6, and the common mode voltage stored in capacitor Cm.

In this second embodiment of the oscillator circuit, the part of the circuit supplying the oscillating signals in phase opposition is directly powered by terminals $V_{SS}$ and $V_{DD}$ to a supply voltage source. The maximum amplitude of the oscillating signals can be slightly less than the supply source voltage. For a supply voltage close to 1.8V, the peak to peak oscillation amplitude can be regulated by construction to a value of 1.6V so as to prevent unsaturating the drain of any of the transistors of the pairs.

This latter circuit has the advantage of consuming half as much power as the preceding circuit for the same oscillating signal amplitude level. It is, however, better suited to a fixed voltage source at nominal $V_{DD}$.

The resonant circuit of both embodiments must, if possible, have a significant quality factor Q, since this has a direct influence on the product of the power consumed by the noise, which has to be minimised in an application to portable systems. Consequently, it is preferable to use external inductors L1 and L2, since the quality factor Q of an integrated inductor with all the other components of the oscillator circuit is generally relatively low.

From the description that has just been given, multiple variants of the voltage controlled oscillator circuit can be conceived by those skilled in the art, without departing from the scope of the invention defined by the claims. The MOS transistors can be replaced by bipolar or other types of transistors.

What is claimed is:

1. A voltage controlled oscillator circuit particularly for a low power electronic device, the oscillator circuit including:
    a resonant circuit provided with at least one inductive element and a capacitive element whose capacitive value varies as a function of a control voltage applied across a capacitive element to adjust the frequency of two oscillating signals in phase opposition which are respectively supplied by a first and a second output terminals of the resonant circuit,
    at least one pair of cross-coupled transistors, which is connected to the resonant circuit to compensate for the resonant circuit losses, the transistors each including a control terminal and a first and second current terminals, the first current terminal of the first transistor or respectively of the second transistor being connected to the first output terminal or respectively the second output terminal of the resonant circuit, whereas the control terminal of each transistor is connected via a coupling capacitor to the first current terminal of the other transistor,
    wherein each transistor of the pair is connected in parallel to a diode mounted transistor, through which a current, supplied by a current source passes, each transistor of the pair and the corresponding diode mounted transistor forming a current mirror to impose a mean current on the resonant circuit so as to supply oscillating signals at a maximum amplitude depending on the sizing of certain elements of said circuit.

2. An oscillator circuit according to claim 1, wherein it includes an oscillating signal amplitude regulation loop in which the current value of the current source of each current mirror varies as a function of the detected oscillating signal amplitude level, the current value decreasing or respectively increasing, when there is an increase or respectively a decrease in the oscillating signal amplitude level.

3. An oscillator according to claim 2, wherein the amplitude regulation loop includes in particular two resistors series connected between the control terminals of the transistors of the pair, and a filtering capacitor, whose first electrode is connected directly or via an arrangement of return transistors, to the connection node of the two resistors, and whose second electrode is connected to a high or low potential terminal of a voltage source, a common mode voltage level, which depends on the oscillating signal amplitude level, being picked up across the first electrode of the filtering capacitor via the connection node of the resistors, to determine the current value of the current sources.

4. An oscillator circuit according to claim 3, wherein the current value of the current sources in the amplitude regulation loop is defined by a reference resistor, which is connected to a current terminal of at least one reference transistor, a control terminal of the reference transistor being connected to the first electrode of the filtering capacitor so as to place the reference resistor and the reference transistor in parallel to the filtering capacitor, the reference transistor being biased by the common mode voltage picked up by the filtering capacitor.

5. An oscillator circuit according to claim 1, wherein the resonant circuit of the pair of cross-coupled transistors are arranged in series between a high potential terminal and a low potential terminal of a regulated voltage source, the second current terminal of each transistor of the pair and of the corresponding diode mounted transistor being directly connected to the high potential terminal or the low potential terminal of the regulated voltage source, and wherein the resonant circuit includes two inductive elements each connected to a respective output terminal of the resonant circuit and to the potential terminal opposite to the potential terminal connecting the second current terminal of the transistors, the variable capacitive element being connected between the two output terminals of the resonant circuit.

6. An oscillator circuit according to claim 5, wherein the pair of cross-coupled transistors, and each diode mounted transistor connected to a corresponding transistor of the pair, are NMOS type transistors, whose source is directly connected to a low potential terminal of a regulated voltage source, and wherein the reference transistor is an NMOS type transistor whose source is connected to the reference resistor, which is connected to a low potential terminal of a voltage source, and whose drain supplies a reference current to a diode mounted PMOS transistor of a second current mirror, which is connected to a high potential terminal of a supply voltage source, two other PMOS transistors of the second current mirror being connected in parallel to the diode mounted PMOS transistor so as to duplicate the reference current to each provide a current to the diode mounted NMOS transistors, the current value depending on the detected oscillating signal amplitude level.

7. An oscillator circuit according to claim 1, wherein it includes a first and second pairs of cross-coupled transistors of different types, the control terminal of each transistor of the two pairs being connected via a coupling capacitor to the first current terminal of the other transistor of the pair, and wherein the resonant circuit, which includes, between the two output terminals an inductive element in parallel to the capacitive element, is placed between the two pairs of transistors, the second current terminal of each transistor of the first pair being connected to a low potential terminal, whereas the second current terminal of each transistor of the second pair is connected to a high potential terminal of a supply voltage source.

8. An oscillator circuit according to claim 7, wherein the first pair of cross-coupled transistors, and each diode mounted transistor connected to a corresponding transistor of the first pair, are PMOS type transistors, whose source is directly connected to a high potential terminal of the supply voltage source, and wherein the second pair of cross-coupled transistors are NMOS type transistors, whose source is directly connected to a low potential terminal of the voltage source.

9. An oscillator circuit according to claim 8, wherein it includes two parallel reference transistors, the reference transistors being NMOS transistors whose source is connected to the reference resistor, which is connected to a low potential terminal of a voltage source, and the drain of each reference transistor supplies a reference current to the respective diode mounted PMOS transistor, wherein the connection node of the two resistors series connected between the gates of the transistors of the first pair is connected to a gate of a return PMOS transistor, whose source is directly connected to the high potential terminal of the voltage source, and whose drain is connected to a diode mounted return NMOS transistor, the source of this NMOS transistor being directly connected to the low potential terminal of the voltage source, wherein the drain and the gate of the return NMOS transistor are connected to the first electrode of the filtering capacitor and to the gates of the reference transistors, and wherein two other resistors are series connected between the control terminals of the NMOS transistors of the second pair, the connection node of these resistors being connected to the first electrode of the filtering capacitor to be used to bias the NMOS transistors of the second pair.

10. An oscillator circuit according to claim 1, wherein each coupling capacitor of the control terminals of the transistors of each pair forms part of a capacitive divider per transistor of each pair, for dividing the voltage of the oscillating signals to be supplied across the control terminals of the transistors of each pair.

\* \* \* \* \*